US008823024B2

(12) United States Patent
Engl et al.

(10) Patent No.: US 8,823,024 B2
(45) Date of Patent: Sep. 2, 2014

(54) OPTOELECTRONIC SEMICONDUCTOR BODY AND METHOD FOR THE PRODUCTION THEREOF

(75) Inventors: Karl Engl, Niedergebraching (DE); Patrick Rode, Regensburg (DE); Lutz Hoeppel, Alteglofsheim (DE); Martin Strassburg, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1016 days.

(21) Appl. No.: 12/920,313

(22) PCT Filed: Feb. 25, 2009

(86) PCT No.: PCT/DE2009/000281
§ 371 (c)(1),
(2), (4) Date: Dec. 7, 2010

(87) PCT Pub. No.: WO2009/106069
PCT Pub. Date: Sep. 3, 2009

(65) Prior Publication Data
US 2012/0086026 A1    Apr. 12, 2012

(30) Foreign Application Priority Data
Feb. 29, 2008 (DE) .......................... 10 2008 011 848

(51) Int. Cl.
*H01L 29/207* (2006.01)
(52) U.S. Cl.
USPC .................. 257/93; 257/E33.066; 438/34
(58) Field of Classification Search
USPC .............................. 257/93, E33.066; 438/34
See application file for complete search history.

(56) References Cited

U.S. PATENT DOCUMENTS

| 5,684,309 A | 11/1997 | McIntosh et al. |
| 5,831,277 A | 11/1998 | Razeghi |

(Continued)

FOREIGN PATENT DOCUMENTS

| DE | 10 2005 007 601 | 9/2005 |
| DE | 10 2005 016 845 | 11/2005 |

(Continued)

OTHER PUBLICATIONS

Schnitzer, I. et al., "30% External Quantum Efficiency From Surface Textured, Thin-Film Light-Emitting Diodes", Appl. Physc. Lett. 63 (18), Oct. 18, 1993 (3 pages).

*Primary Examiner* — Marvin Payen
(74) *Attorney, Agent, or Firm* — Cozen O'Connor

(57) ABSTRACT

An optoelectronic semiconductor body comprises a substantially planar semiconductor layer sequence having a first and a second main side, which has an active layer suitable for generating electromagnetic radiation. Furthermore, the semiconductor body comprises at least one trench that severs the active layer of the semiconductor layer sequence and serves for subdividing the active of the semiconductor layer sequence into at least two electrically insulated active partial layers. A first and second connection layer arranged on a second main side serve for making contact with the active partial layers. In this case, the first and second connection layers for making contact with the at least two active partial layers are electrically conductively connected to one another in such a way that the active partial layers form a series circuit.

16 Claims, 10 Drawing Sheets

(56) References Cited

U.S. PATENT DOCUMENTS

| | | |
|---|---|---|
| 5,952,681 A | 9/1999 | Chen |
| 6,111,272 A | 8/2000 | Heinen |
| 6,172,382 B1 | 1/2001 | Nagahama et al. |
| 6,635,902 B1 | 10/2003 | Lin |
| 2005/0035354 A1 | 2/2005 | Lin et al. |
| 2005/0224822 A1 | 10/2005 | Liu |
| 2006/0113548 A1 | 6/2006 | Chen et al. |
| 2006/0163589 A1 | 7/2006 | Fan et al. |
| 2007/0090377 A1 | 4/2007 | Lin et al. |
| 2007/0131958 A1 | 6/2007 | Hsu et al. |
| 2007/0284598 A1* | 12/2007 | Shakuda et al. ............. 257/93 |
| 2008/0142780 A1 | 6/2008 | Bader et al. |
| 2009/0026972 A1 | 1/2009 | Shakuda |
| 2009/0057693 A1 | 3/2009 | Takeuchi et al. |
| 2009/0065800 A1 | 3/2009 | Wirth et al. |
| 2010/0007269 A1 | 1/2010 | Klein et al. |
| 2010/0171135 A1 | 7/2010 | Engl et al. |
| 2011/0101390 A1 | 5/2011 | Engl et al. |

FOREIGN PATENT DOCUMENTS

| | | |
|---|---|---|
| DE | 10 2006 055 884 | 4/2008 |
| DE | 10 2007 019 775 | 10/2008 |
| DE | 10 2007 022 947 | 10/2008 |
| EP | 0 905 797 | 3/1999 |
| JP | 2002-335010 | 11/2002 |
| JP | 2004-080050 | 3/2004 |
| JP | 2006-073815 | 3/2006 |
| JP | 2007-116097 | 5/2007 |
| JP | 2007-324581 | 12/2007 |
| JP | 2008-047618 | 2/2008 |
| TW | I254469 | 5/2006 |
| WO | WO 01/39282 | 5/2001 |
| WO | WO 01/47039 | 6/2001 |
| WO | WO 02/13281 | 2/2002 |
| WO | WO 2006/061728 | 6/2006 |
| WO | WO 2006/098545 | 9/2006 |
| WO | WO 2007/072873 | 6/2007 |
| WO | WO 2008/091837 | 7/2008 |
| WO | WO 2008/131743 | 11/2008 |

\* cited by examiner

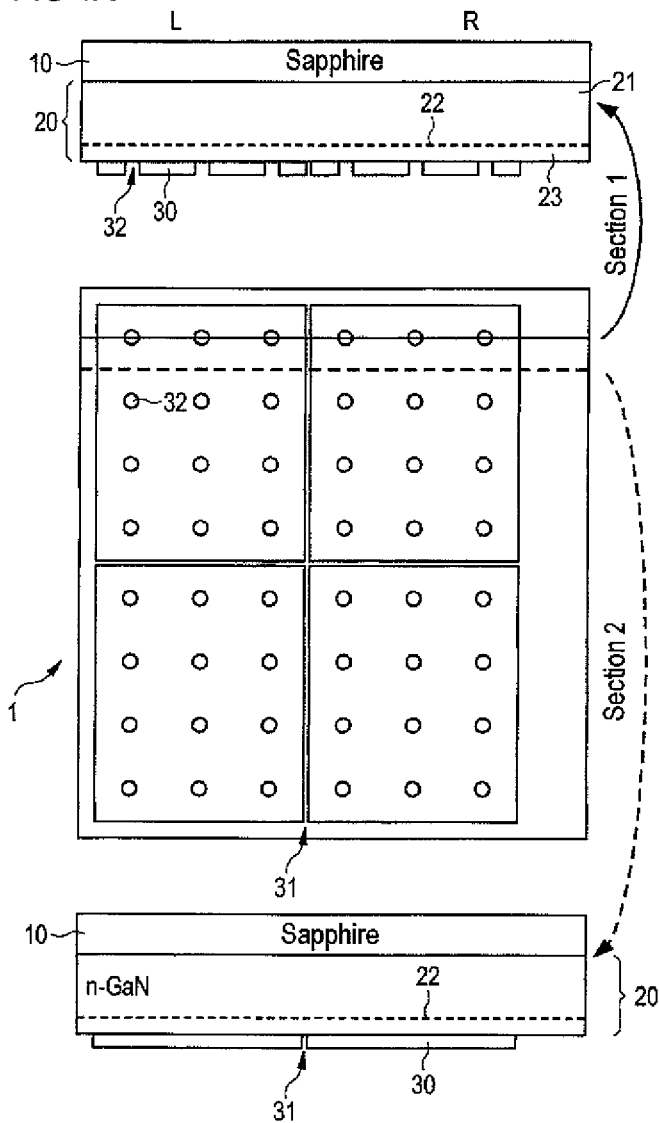

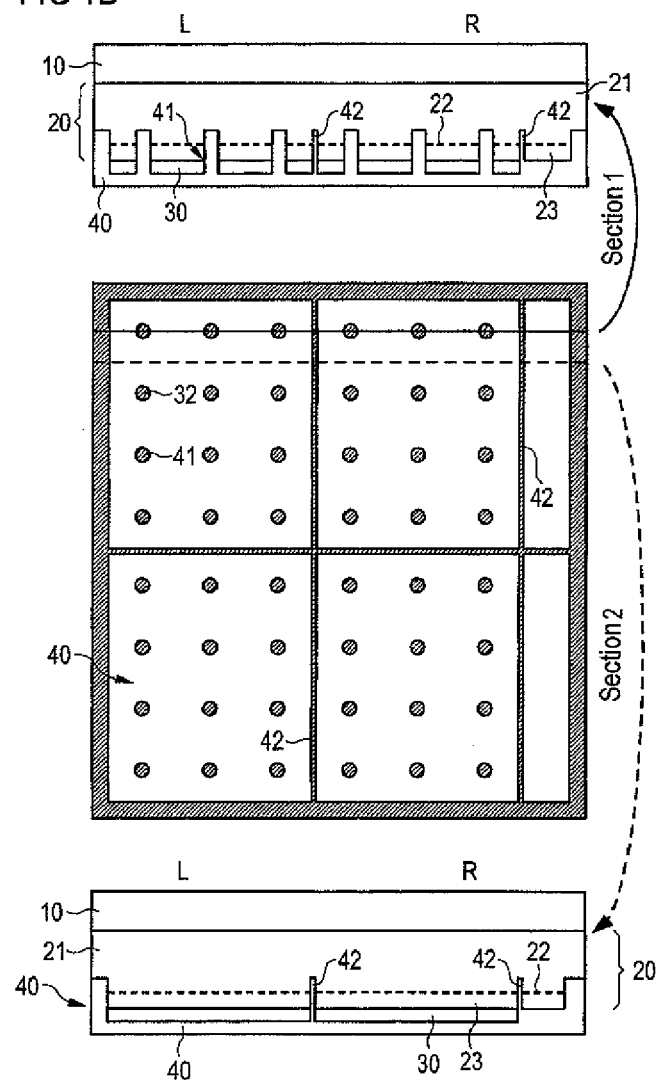

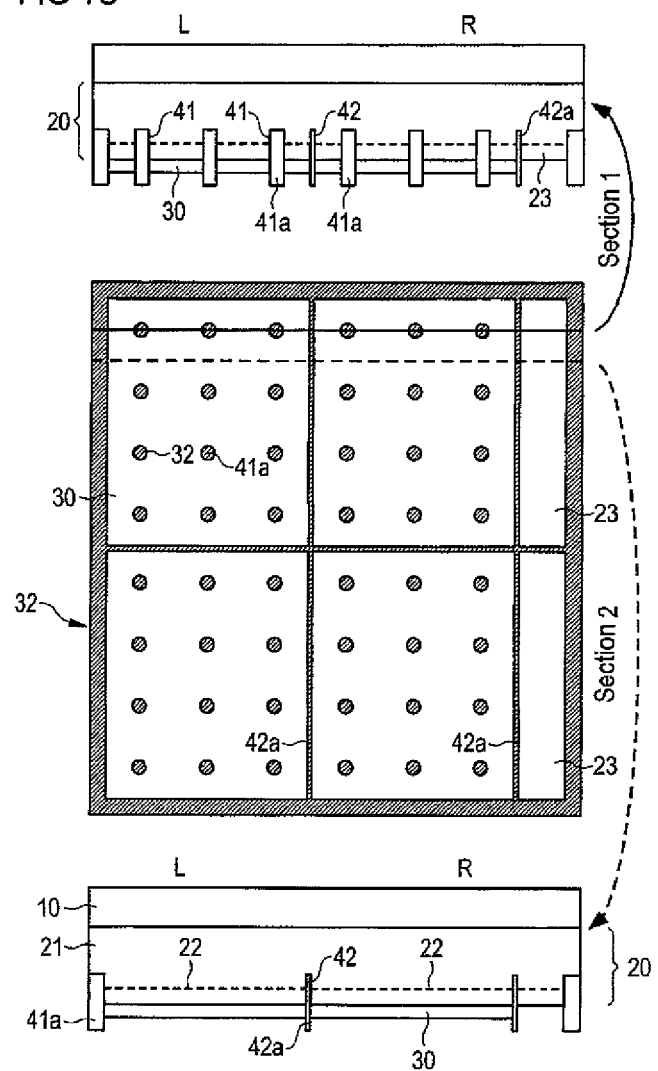

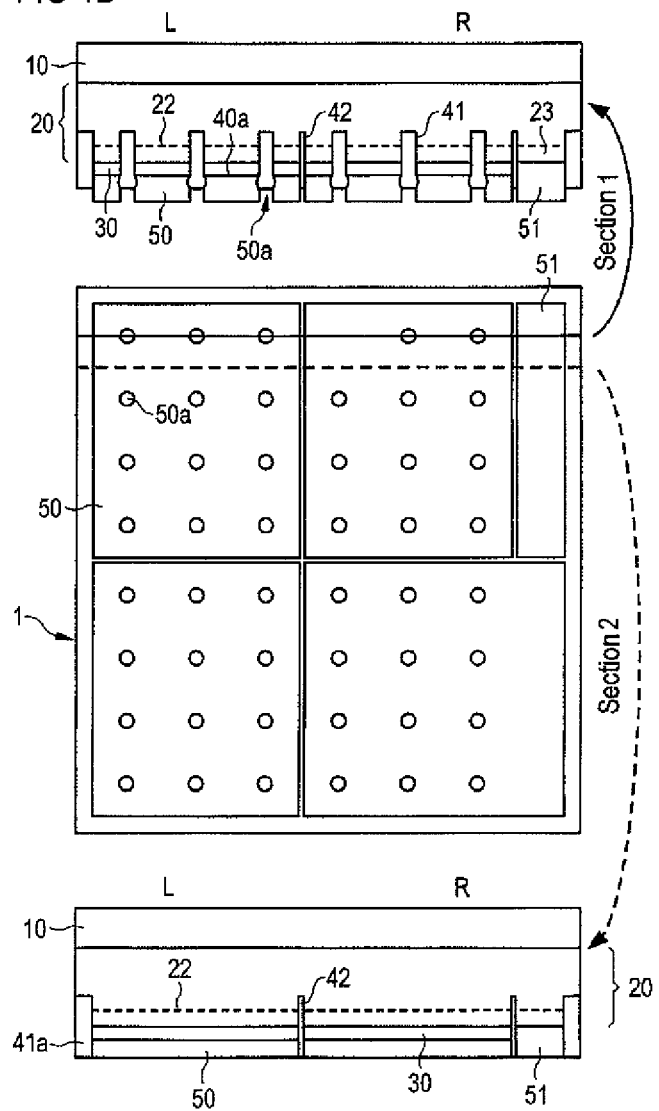

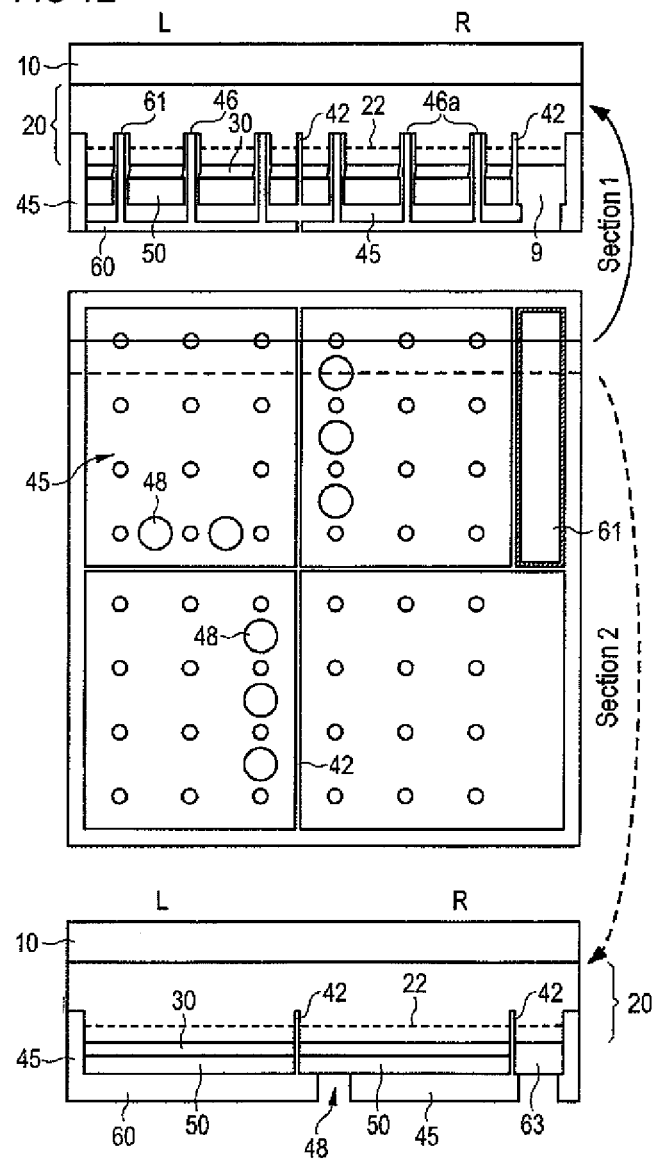

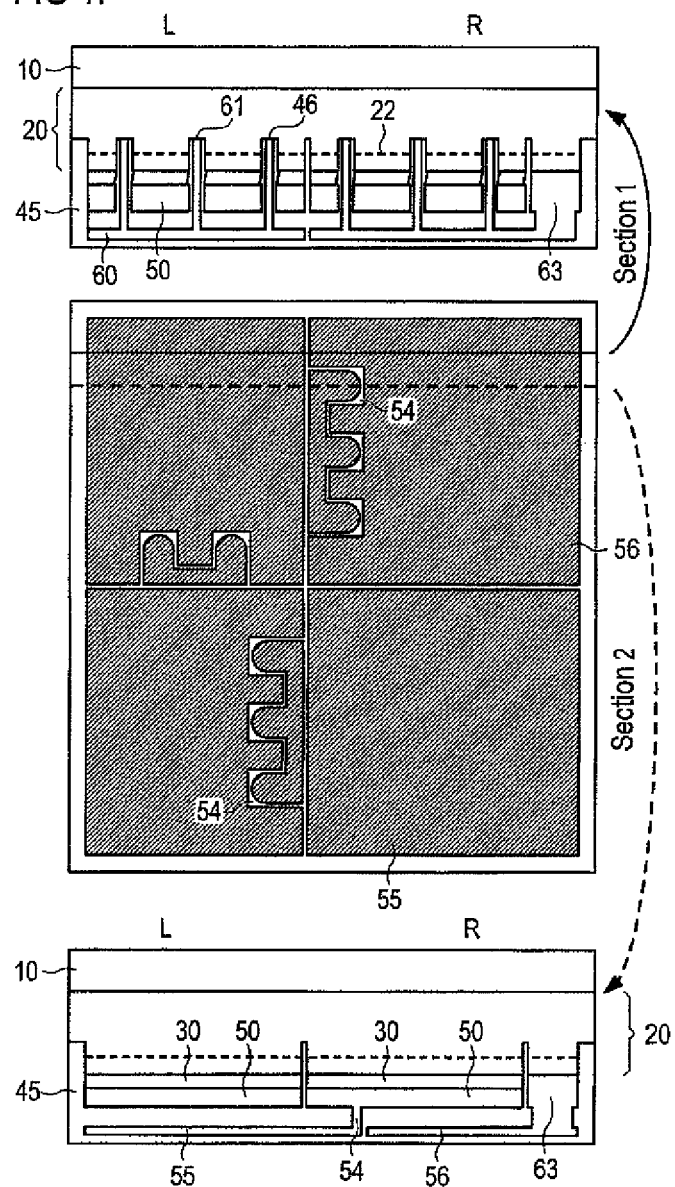

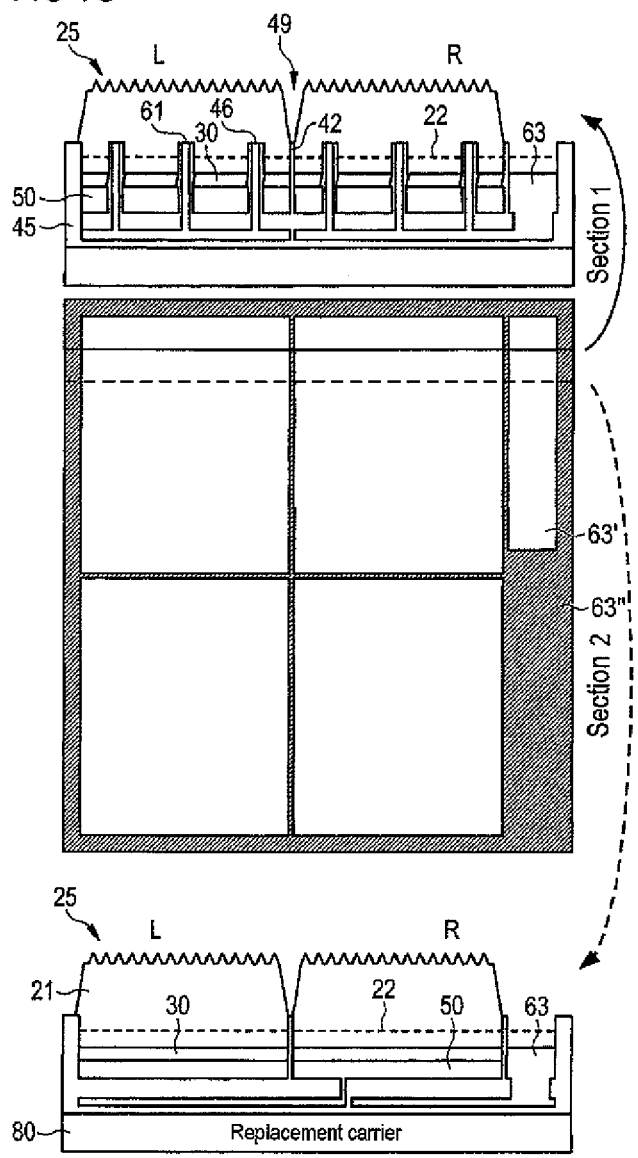

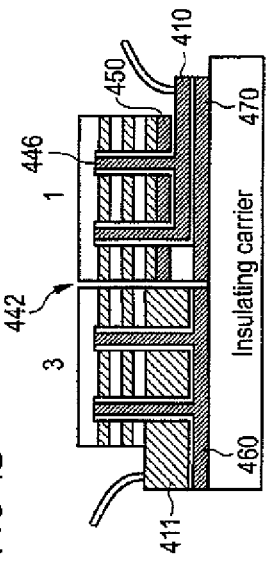
FIG 4A
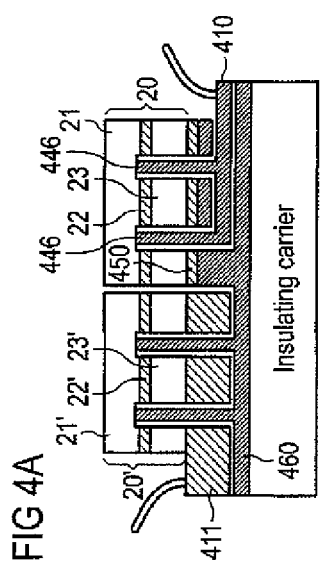
FIG 4B
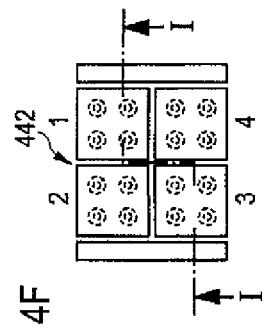
FIG 4C
FIG 4D
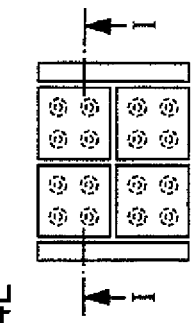
FIG 4E
FIG 4F

OPTOELECTRONIC SEMICONDUCTOR BODY AND METHOD FOR THE PRODUCTION THEREOF

RELATED APPLICATIONS

This is a U.S. national stage of application No. PCT/DE2009/000281, filed on Feb. 25, 2009.

This application claims the priority of German patent application no. 10 2008 011 848.6 filed Feb. 29, 2008, the entire content of which is hereby incorporated by reference.

FIELD OF THE INVENTION

The invention relates to an optoelectronic semiconductor body, and to a method for producing an optoelectronic semiconductor body.

BACKGROUND OF THE INVENTION

Optoelectronic semiconductor bodies are used for a multiplicity of different lighting applications. They are appropriate primarily if a high luminous efficiency is required in a small space. Examples of the use of optoelectronic semiconductor bodies are found in projection applications and also in the automotive field, the latter including the use of front headlights, inter alia.

SUMMARY OF THE INVENTION

One object of the invention is to provide an optoelectronic semiconductor bodies which have an improved efficiency in conjunction with lower complexity by comparison with conventional illumination means.

This and other objects are attained in accordance with one aspect of the present invention directed to an optoelectronic semiconductor body comprises a semiconductor layer sequence arranged substantially in planar fashion and having a first and a second main side, and also an active layer suitable for generating electromagnetic radiation.

In this case, the active layer can have a pn junction, a double heterostructure, a single quantum well (SQW) or a multi-quantum well (MQW) structure for generating radiation. The designation quantum well structure exhibits no significance whatsoever with regard to the dimensionality of the quantization. It generally encompasses, inter alia, quantum wells, quantum wires and quantum dots and any combination of these structures. Examples of multi quantum well structures are described in the documents WO 01/39282, U.S. Pat. No. 5,831,277, U.S. Pat. No. 6,172,382 and U.S. Pat. No. 5,684,309. The disclosure content thereof is hereby incorporated by reference.

In the configuration, the first main side is provided for emitting electromagnetic radiation. Furthermore, at least the active layer of the semiconductor layer sequence is subdivided into at least two active partial layers by a trench penetrating through the active layer, said active partial layers being electrically insulated from one another. In other words, the trench severs the active layer of the semiconductor layer sequence, whereby active partial layers that are electrically insulated from one another are formed in the semiconductor layer sequence.

The optoelectronic semiconductor body furthermore comprises respectively a first and second electrical connection layer arranged on the second main side and for making contact with the active partial layers. In this case, the expression of a connection layer arranged on the second main side means that at least one part of the first and second electrical connection layer, respectively, succeeds the semiconductor layer sequence in the direction from the front side toward the rear side. In this case, however, it is not necessary for the first and second electrical connection layer, respectively, to be applied directly on the second main side of the semiconductor layer sequence. Moreover, the first and second electrical connection layer does not have to completely cover the second main side of the semiconductor layer sequence. Rather, the first and second electrical connection layers are arranged for making contact with the active partial layers at least in part on the second main side. Consequently, they are nearer to the second main side than to the first main side of the semiconductor layer sequence.

According to an embodiment of the invention, the first and second electrical connection layers which respectively in a manner making contact with the at least two electrically insulated active partial layers are electrically conductively connected to one another in such a way that the active partial layers form a series circuit.

In other words, the two connection layers of the active partial layers are connected to one another in such a way that the active partial layers form a series circuit.

The optoelectronic semiconductor body is thus divided into partial regions which are electrically connected to one another by the different connection layers with the formation of a series circuit. What is thus achieved is that the optoelectronic semiconductor body has a significantly lower current flow in an operating mode. Rather, the individual active partial regions are now connected to one another in a series circuit. The optoelectronic semiconductor body can thus be fed in a voltage-driven manner in conjunction with low currents. As a result, by way of example, expensive driver stages and also high-current sources can be replaced by corresponding high-voltage sources, which are easier to manufacture. As a result of the subdivision into partial regions, the optoelectronic semiconductor body can thus be operated with different voltages that can be chosen depending on the subdivision.

The semiconductor body is expediently formed in monolithic fashion, that is to say that it comprises only one body, in which all the conduction planes, and also active layers are integrated and are implemented successively during production. This permits large-area production over the entire wafer, including an embodiment of the active layers and the conduction planes on a common substrate.

In one configuration, the semiconductor body is a thin-film light-emitting diode chip. In particular, it has a carrier substrate at its rear side. In one configuration, the first and the second electrical connection layer are arranged at least in places between the semiconductor layer sequence and the carrier substrate. A thin-film light-emitting diode chip is distinguished by at least one of the following characteristic features:

a reflective layer is applied or formed at a main area facing a carrier element, in particular the carrier substrate of the radiation-generating semiconductor layer sequence, which is, in particular, a radiation-generating epitaxial layer sequence, said reflective layer reflecting at least part of the electromagnetic radiation generated in the semiconductor layer sequence back into the latter;

the thin-film light-emitting diode chip has a carrier element, which is not the growth substrate on which the semiconductor layer sequence was grown epitaxially, but rather a separate carrier element subsequently fixed to the semiconductor layer sequence;

the semiconductor layer sequence has a thickness in the range of 20 μm or less, in particular in the range of 10 μm or less;

the semiconductor layer sequence is free of a growth substrate. In the present case "free of a growth substrate" means that a growth substrate used for the growth process, if appropriate, is removed from the semiconductor layer sequence or at least greatly thinned. In particular, it is thinned in such a way that it is not self-supporting by itself or together with the epitaxial layer sequence alone. The remaining residue of the greatly thinned growth substrate is, in particular, unsuitable as such for the function of a growth substrate; and the semiconductor layer sequence contains at least one semiconductor layer with at least one area which has an intermixing structure which ideally leads to an approximately ergodic distribution of the light in the semiconductor layer sequence, that is to say that it has an as far as possible ergodically stochastic scattering behavior.

A basic principle of a thin-film light-emitting diode chip is described for example in the document I. Schnitzer et al., Appl. Phys. Lett. 63 (16) Oct. 18, 1993, pages 2174-2176, the disclosure content of which in this respect is hereby incorporated by reference. Examples of thin-film light-emitting diode chips are described in the documents EP 0905797 A2 and WO 02/13281 A1, the disclosure content of which in this respect is hereby likewise incorporated by reference.

To a good approximation, a thin-film light-emitting diode chip is a Lambertian surface emitter and is therefore well suited for example to application in a headlight, for instance a motor vehicle headlight.

In a further configuration, the trench extends substantially perpendicularly to the active layer of the semiconductor layer sequence. It can extend completely through the active layer of the semiconductor layer sequence.

The trench can be filled with an electrically insulating material and lie in the region of a few micrometers thickness. Preferably, it penetrates through at least that region of the active layer in which the charge carriers are recombined and electromagnetic radiation is thus generated. As an alternative, the trench can extend perpendicularly through a large region of the semiconductor layer sequence and thus subdivide the semiconductor layer sequence into partial regions with in each case an active partial layer. This reduces leakage currents between the individual partial regions or the active partial layers. By way of example, the trench can also perpendicularly sever at least one of the two connection layers.

In one configuration, the first electrical connection layer for making contact with a first of the at least two active partial layers is electrically conductively connected to the second electrical connection layer for making contact with a second of the at least two active partial layers. In other words, the n-doped region of a first active partial layer is thus electrically conductively connected to a p-doped region of a second active partial layer by the connection layer. A series circuit composed of the two active partial layers is formed as a result.

For making contact with the active partial layers, one configuration provides for a second partial region of the second electrical connection layer to extend from the second main side through a perforation in the active partial layer toward the first main side. Consequently, perforations are formed through the active partial layer, with which it is possible to make contact with the region of the active partial layer toward the first main side.

The light-emitting first main side of the semiconductor layer sequence and of the optoelectronic component is advantageously free of electrical contact locations. The risk of shading or absorption of part of the electromagnetic radiation emitted by the active partial layer during operation by the electrical contact location is reduced in this way. In one configuration of the invention, the respective first and second electrical connection layers thus comprise partial regions which are connected to contact locations on the side of the semiconductor body that is remote from the first main side. As an alternative, in one configuration of the invention, a contact area is configured on the first main side of the semiconductor body alongside a radiation-emitting region. The latter is electrically conductively coupled to the first and/or the second electrical connection layer.

Preferably, the first and/or the second electrical connection layer can be configured with a conductive mirror layer, such that electromagnetic radiation which in the direction of the second main side is reflected in the direction of the first main side. In another configuration, a mirror layer is arranged at least in places between the semiconductor layer sequence and/or the second electrical connection layer. Said mirror layer can be semiconducting or else electrically insulating. In the latter case, it can have a plurality of openings through which the first and/or the second electrical connection layer make contact with the semiconductor layer sequence and the active partial layers. It is likewise possible to provide a lateral current distribution layer between the semiconductor layer sequence and the first electrical connection layer in order to improve a coupling-in of current. The current spreading layer can comprise a conductive oxide, but can also have a mirror layer and thus serve as a reflection layer.

As an alternative, the active layer of the semiconductor layer sequence can comprise a plurality of active partial layers stacked one above another. By way of example, the active layer can comprise a double heterostructure or multi quantum well. Furthermore, partial regions of the active layer can be doped differently, such that electromagnetic radiation having a differing wavelength is emitted upon recombination. By way of example, the active partial layers in the different partial regions can be doped differently, such that electromagnetic radiation having a differing wavelength is emitted into the individual partial regions.

In order to improve the emission, the first main side of the layer sequence can be structured. It is likewise possible to apply a conversion material to the first main side in order thus to convert the emitted electromagnetic radiation into a second radiation having a different wavelength. In the case of a correspondingly suitable conversion material and specific material systems for the active layer, it is thereby possible to generate white light for example for front headlights or projection systems.

In one configuration, the optoelectronic semiconductor body according to an embodiment of the invention is produced by epitaxially growing a semiconductor layer sequence on a growth substrate. In this case, the semiconductor layer sequence is grown with the formation of an active layer suitable for generating electromagnetic radiation. Furthermore, a first electrical connection layer is applied at a side of the semiconductor layer sequence that is remote from the first main side, for the purpose of making contact with the active layer, and a separating layer and a second electrical connection layer are applied, wherein the first electrical connection layer, the separating layer and the second electrical connection layer are formed such that they laterally overlap at least in part.

Another aspect of the present invention is directed to a method that comprises the step of forming an electrically insulating trench at least in the active layer of the semiconductor layer sequence for the purpose of subdividing the semiconductor layer sequence and in particular the active layer into at least two active partial layers. By means of this step, therefore, the semiconductor layer sequence is subdivided into partial regions with a respective active partial layer. Contact is made with these active partial layers by the first and second connection layers in such a way that the two active partial layers form a series circuit.

Expediently, the process of forming an electrically insulating trench is effected after the process of applying the first electrical connection layer, whereby the first electrical connection layer is likewise subdivided. In the further course of the method, the first electrical connection layer of a first partial region or in a contact-making manner of a first active partial layer is then electrically conductively coupled to the second electrical connection layer of a second partial region or in a contact-making manner of a second active partial layer. As a result, the two active partial layers are connected in series with one another.

One configuration of the method involves forming a perforation in the active layer and also forming a partial region of the second electrical connection layer in the perforation, wherein the second electrical connection layer is electrically insulated from the first electrical connection layer by means of the separating layer. Through the partial region, the second electrical connection layer makes contact with the active layer and in particular the active partial layers. For this purpose, in each partial region—formed by the trenches—of the semiconductor layer sequence or of the active partial layers, it is possible to provide a perforation in the respective active partial layer.

For this purpose, the electrically insulating trench and the perforation can be produced by a jointly performed process of etching the active layer.

In another configuration, the first electrical connection layer is formed in reflective fashion, such that electromagnetic radiation generated in the active layer, emitted in the direction of the side remote from the first main side, is reflected from the first electrical connection layer in the direction of the first main side.

In one development, a perforation is worked in the separating layer, too, and said perforation is filled with a material, which perforation electrically conductively connects the first electrical connection layer, which makes contact with a first active partial layer, to the second electrical connection layer, which makes contact with a second active partial layer. A connection between those active partial layers which are separated by the trench is produced in this way. Said partial layers can then be connected up further in a series and/or parallel circuit, for example.

In yet another configuration, contact panels are formed on the side remote from the first main side, which contact panels electrically connect the individual active partial layers in a manner respectively making contact with the first and second electrical connection layers. Accordingly, current can be individually applied to each active partial layer by means of the individual contact panels. This enables the individual partial regions of the semiconductor layer sequence to be driven selectively. In external electronics, the active partial layers of the semiconductor layer sequence in the partial regions can thus be connected in series and/or in parallel depending on the desired application.

In a further configuration of the method, at least one part of the growth substrate is removed after the growth of the semiconductor layer sequence. This removal can be effected before or after the application of the individual connection layers. By way of example, it can be carried out, in particular, after subdivision into individual partial regions and after contact has subsequently been made with the individual partial regions. The growth substrate can be split off, for instance by means of a laser lift-off method.

Before the removal of the growth substrate, in one configuration, a carrier substrate can be arranged at the rear side of the semiconductor body. Said carrier substrate can be a separate carrier element that is connected to the semiconductor layer sequence by means of a solder or adhesive layer, for example. In addition, the carrier substrate can constitute a part of the first and/or second electrical connection layer. In a further configuration, a semiconducting or electrically insulating mirror layer is embodied in places at the rear side of the semiconductor layer sequence. In the case of said mirror layer, openings can be provided in the mirror layer, through which the active layer can be electrically connected to the first and/or second electrical connection layer. The first and/or the second electrical connection layer thus respectively contain partial regions which extend through the openings of the mirror layer.

BRIEF DESCRIPTION OF THE DRAWINGS

FIGS. 1A to 1G show an exemplary embodiment of a method for producing an optoelectronic semiconductor body according to the invention, FIGS. 4A, 4B show schematic sectional illustrations in accordance with one embodiment, FIGS. 4C, 4D show equivalent circuit diagrams of the embodiments in FIGS. 4A, B, FIGS. 4E, F show plan views over an optoelectronic semiconductor body subdivided into four partial regions corresponding to the sectional illustrations and the equivalent circuit diagrams in FIGS. 4A to D, FIGS. 5A, B show plan views over an optoelectronic semiconductor body with configurations of perforations through the active layer.

DETAILED DESCRIPTION OF THE DRAWINGS

Figure 2:
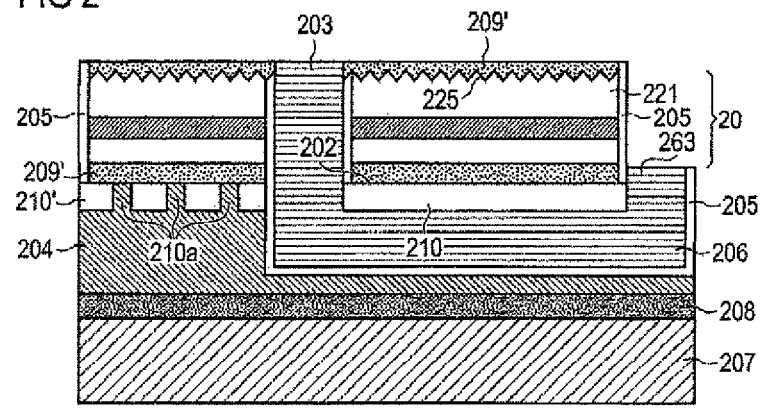
FIG. 2 shows a sectional illustration of an optoelectronic semiconductor body in accordance with a further embodiment.

In the exemplary embodiments, the size relationships of the elements illustrated should not be regarded as true to scale, in principle. Rather, individual elements, for instance layers, may be illustrated with an exaggerated size or thickness in order to afford a better understanding and/or in order that they can be better illustrated.

FIGS. 1A to 1G show an exemplary embodiment of a method for producing a monolithic optoelectronic semiconductor body according to the invention.

The term monolithic is understood to mean production wherein individual layers are not produced separately from one another. Rather, deposition or formation of layers is effected, irrespective of what function they fulfill, on a layer produced in a preceding process step. As a result, a semiconductor body is produced in successive steps.

Schematic sectional illustrations and also plan views in different stages of the method are illustrated. In particular, in order to clarify the series circuit produced by the connection layers, two sectional figures identified by the solid and dashed line, respectively, are illustrated in each case.

In the method, firstly a semiconductor layer sequence 20 is grown epitaxially on a growth substrate 10.

The semiconductor layer sequence 20 is based on a semiconductor material system which can be doped differently depending on the application. By way of example, it is possible to use III/V compound semiconductors or else II/VI compound semiconductors. The semiconductor layer sequence 2 in the present case has a thickness of between five micrometers and seven micrometers.

A III/V compound semiconductor material comprises at least one element from the third main group, such as, for example, Al, Ga, In, and an element from main group V, such as, for example, B, N, P, As. In particular, the term "III/V compound semiconductor material" encompasses the group of binary, ternary or quaternary compounds which contain at least one element from the third main group and at least one element from the fifth main group, in particular nitride and phosphide compound semiconductors. Such a binary, ternary or quaternary compound can moreover comprise for example one or more dopants and also additional constituents. The relevant III/V compound semiconductor material include for example nitride III compound semiconductor material and phosphide III compound semiconductor material, for example GaN, GaAs, and InGaAlP. The material system AlGaN/GaN is likewise counted among the compound semiconductors mentioned above.

Correspondingly, a II/VI compound semiconductor material comprises at least one element from the second main group, such as, for example, Be, Mg, Ca, Sr, and an element from the sixth main group, such as, for example, O, S, Se. In particular, a II/VI compound semiconductor material comprises a binary, ternary or quaternary compound which comprises at least one element from the second main group and at least one element from the sixth main group. Such a binary, ternary or quaternary compound can moreover comprise for example one or more dopants and also additional constituents. The II/VI compound semiconductor materials include, for example, ZnO, ZnMgO, CdS, CnCdS, MgBeO.

Depending on the desired wavelength or the desired wavelength spectrum, it is possible to provide one or else a plurality of the abovementioned compounds as material system for an optoelectronic component.

The semiconductor layer sequence 20 illustrated has a first n-doped layer 21, which is grown in a manner adjacent to the growth substrate 10 composed of sapphire, for example. Depending on the desired application, however, this doping uniformly in the layer 21 can also have a gradual difference. A p-doped layer 23 is connected thereto, and is therefore arranged on that side of the semiconductor layer sequence 20 which is remote from the growth substrate 10. By virtue of the different doping of the two layers 21 and 23, an active layer 22 formed between them. The thickness of said active layer 22 is dependent on the doping of the two layers 21 and 23 grown. During subsequent operation of the arrangement, the charge carriers injected into the layers 21 and 23 recombine in the active layer 22 and in the process emit electromagnetic radiation in a manner dependent on the band gap of the semiconductor system used. Therefore, in the case of the layer sequence 21 and 23, reference is also made to an active layer. The latter is arranged uniformly over the optoelectronic semiconductor body in the present case.

In an alternative configuration, the semiconductor layer sequence 2 is formed as an npn layer sequence, in which a further n-doped layer is formed on that side of the p-doped layer 23 which is remote from the n-doped layer 21. In another configuration, the p-doped layer 23 is adjacent to the growth substrate 10 and the n-doped layer 21 is remote from the growth substrate 10.

In another variant, before the growth of the semiconductor layer sequence 20, an additional buffer layer is applied on the growth substrate 10 composed of sapphire. This permits the lattice constant of the subsequent layer sequence that is to be grown to be matched to the growth substrate 10, thus reducing stresses and possible defects in the layer sequence. In addition, said buffer layer can be undoped or weakly n-doped, for example in the concentration of $2 \times 10^{17}$ atoms/cm$^3$ or less. Although a buffer layer of this type is not suitable for allowing the operating current of the semiconductor body to flow through said buffer layer, in the completed semiconductor body said buffer layer reduces the risk of damage or destruction by an electrostatic discharge.

In the configuration of the method, after the production of the semiconductor layer sequence 20 has ended, a conductive contact layer 30 is applied on the p-doped layer 23 of the semiconductor layer sequence. Said conductive layer 30 can additionally be reflective, such that electromagnetic radiation emitted during subsequent operation in the direction of the electrically conductive layer 30 is reflected from the latter and emitted in the desired direction. The conductive material can comprise for example silver or some other reflective metal.

Afterward, the conductive layer 30 is structured by means of a photomask and, by way of example, circular contact openings 32 arranged in a regular manner are thus formed. This can be discerned in the plan view of the semiconductor body 1 in the middle illustration. Furthermore, a trench 31 is etched into the conductive layer 30, such that the electrically conductive layer is subdivided into four partial regions as illustrated in the present case. These partial regions correspond to the subsequent subdivision of the optoelectronic semiconductor body into four partial regions. For clarification, in the two sectional illustrations, the right-hand partial region of the optoelectronic semiconductor body is designated by R and the left-hand partial region of the semiconductor body is designated by L.

Afterward, in accordance with FIG. 1B, a plurality of perforations for making contact with the layer 21 are formed in the semiconductor layer sequence. This is effected for example by suitably etching the semiconductor layer sequence, wherein the structured metallization applied thereto can serve as an etching mask. The individual perforations 41 pass through the active layer 22 of the semiconductor layer sequence 2 and thus make contact with the n-doped layer 21. Furthermore, the region of the trench 31 of the metallic layer is also etched, such that a trench 42 likewise extending through the active layer is formed in the semiconductor layer sequence.

By means of suitable measures it is possible, moreover, to stop the perforations for making contact with the semiconductor layer 21 at a certain depth, while the trench 42 attains a significantly larger depth. By way of example, the etching process is stopped upon reaching the first depth of the perforations 41, then the latter are covered by means of a photomask and the trench 42 is etched further down to the final depth. Of course, trench and perforations can also have the same depth for the first time. With the aid of the newly formed trenches 42, the optoelectronic semiconductor body is subdivided into a multiplicity of partial regions, wherein the active layer 22 is correspondingly separated into active partial layers. The production of a plurality of perforations 41 in the different partial regions of the optoelectronic semiconductor body additionally results in a homogeneous lateral current distribution in the n-doped layer 21.

After the end of the different etching methods for producing the trench 42 and the perforations 41, a non-conductive layer 40 is applied, which fills the trenches 42 and also the perforations 41. This insulating layer can be configured in transparent fashion, for example, such that, as illustrated in the plan view in FIG. 1B, the individual trenches 42 and also the perforations 32 are still discernible.

In a next step, in accordance with FIG. 1C, the insulating layer is removed in the region of the electrically conductive layer 30 and also in the outer right-hand part of the optoelectronic semiconductor body with the aid of a photomask. By contrast, the insulating material is maintained in the region of the perforations 41 and of the trenches 42, such that corresponding pillars 41a, 42a are formed. The second layer 23 of the semiconductor layer sequence 20 is likewise uncovered in the right-hand region of the optoelectronic semiconductor body. It subsequently serves for making contact with the semiconductor layer sequence for an operating mode of the semiconductor body. The plan view now reveals the uncovered webs 42a in the region of the trenches 42 and also the pillars 41a in the region of the perforations 41.

After removal of the insulating material outside the trenches 42 and the perforations 41, as illustrated in FIG. 1D, a further conductive contact-making layer 50 is applied and structured, with the result that openings 50a are formed into said layer in the region of the perforations 41 and of the trenches 42. Likewise, electrically conductive material 51 is correspondingly applied to the second layer 23 of the semiconductor layer 20 in the right-hand region of the optoelectronic semiconductor body. The material of the layers 50 subsequently forms one of the two connection layers for making contact with the partial layers.

Accordingly, as can be discerned in the sectional illustrations section 1 and section 2, the metallic contact-connection 50 is interrupted in the region of the trenches 42 and of the perforations 41. This is clearly discernible in the plan view in FIG. 1D. The right-hand lower partial region of the optoelectronic semiconductor body in FIG. 1D subsequently forms a first contact panel, while the material deposited in the region 51 constitutes a second contact panel.

The conductive layers 30 and 50 applied in the previous method steps can, by way of example, be applied by vapor deposition and have different thicknesses. Thus, inter alia, the layer 30 can be made thinner than the conductive layer 50. Furthermore, the conductive layer 30 can also be suitable as a current spreading layer for the best possible lateral distribution of subsequent charge carriers to be indicated. The two layers can comprise the same and different materials.

In accordance with FIG. 1E, an insulating layer 45 is then applied to the conductive materials 50 and 51. Said insulating layer is removed again in the region 51. Preferably, the same material which also fills the perforations 40 and the trenches 42 is used as the insulating layer. Afterward, by means of a photomask, the insulating material 45 in the perforations 41 is etched and partly removed. Insulating material continues to be present, however, at the walls of the perforations 41. The etching process can be effected anisotropically and, in the center of the trench, removes the insulating material as far as the bottom of the perforations 41. The still insulating sidewalls in the perforations prevent the material 60 introduced in the next step from causing a short circuit with the individual layers of the semiconductor layer sequence 2.

Accordingly, in the perforations, a separating layer is formed on a part of the surface of the perforations. Said separating layer covers the peripheral sidewall and respectively the sidewalls of the perforations 42 at least in places in the regions of the metallic layer 30, the contact-making layer 50 and also the layer 23 of the layer sequence 20. The separating layer 45 additionally covers the contact-making layer 50 and completely fills the trench 42.

Afterward, the perforations 41 are filled with a material 60, thus resulting in contact-making elements 46 for the first layer 21 of the semiconductor layer sequence 20. In accordance with the sectional illustration section 1 in FIG. 1E, the contact-making region 63 is completely filled with the conductive material 60, such that it forms an electrical contact with the first layer 21 via the contact elements 46a. Between the right-hand and the left-hand partial region of the optoelectronic semiconductor body, moreover, the layer 60 is separated in the region of the trench 42.

Openings 48 are furthermore illustrated in the plan view of the optoelectronic semiconductor body. As in the sectional illustration section 2, said openings are formed by holes which are made in the passivation layer 45 and reach as far as the contact-making layer 50.

FIG. 1F shows the structure after further production steps. A passivation layer is applied to the layer 60 contact-connecting the region 63 to the trenches 42 of each partial region. Said passivation layer is composed of the same material as the layer 45, the holes 48 still being cut out. Said holes are filled with a conductive material 54 in the subsequent steps, as can be seen from the illustration in section 2. Furthermore, a material layer 55 is deposited on the surface of the passivation layer, no electrical contact being produced between a partial region 56 of the material which is connected to the connection 63 and the material of the region 55. This can be effected for example by planar application of the material into the holes and also onto the surface of the passivation layer 45 and subsequent structuring.

The layer of the partial region 56 is electrically conductively connected to the layer 60 making contact with the perforations 46. It thus forms a first electrical connection layer for making contact with the layer 21 of the layer sequence 20. The layers 50 of the right-hand partial region R correspondingly form a second electrical connection layer for making contact via the intermediate layer 30 of the semiconductor layer sequence 20. The second electrical connection layer 50 of the right-hand partial region R is connected via the element 54 to the layer 55 in the left-hand partial region L of the optoelectronic semiconductor body. The layer 55 is in turn electrically conductively contact-connected to the layer 60 of the left-hand partial region L that makes contact with the perforations 46 in the left-hand partial region L of the optoelectronic semiconductor body.

The layers 55 and 60 of the left-hand partial region L correspondingly form a first electrical connection layer of the left-hand partial region for making contact with the active partial layer in the optoelectronic semiconductor body. It is evident from this that in the series circuit shown, the second electrical connection layer of a partial region of the optoelectronic semiconductor body is connected to the first electrical connection layer of a second partial region of the optoelectronic semiconductor body and the formation of a series circuit.

In a subsequent method step in accordance with FIG. 1G, a replacement carrier 80 is subsequently fixed, by means of a solder or adhesive layer, on the rear side of the semiconductor layer sequence 2 remote from the growth substrate 10. For this purpose, the replacement carrier can consist for example of aluminum nitride or some other material. In particular insulating replacement carrier substrates 80, for instance glass carrier substrates, are suitable for this purpose.

In a subsequent method step, the growth substrate 10 is thinned and then completely removed. This can be effected for example by means of a laser lift-off method that is known, in principle, to the person skilled in the art. For this purpose, the growth substrate 10 or respectively the semiconductor layer sequence 20 can have an additional sacrificial layer, which is decomposed upon irradiation by means of a laser. The growth substrate 10 is broken off as a result.

Afterward, that side of the semiconductor layer sequence 20 which is remote from the replacement carrier 80 is supplemented by coupling-out structures 25. Furthermore, in the region of the trench 42, the semiconductor layer sequence is removed from the top side, with the result that a trench-type gap 49 is formed. The latter then completely separates the partial regions of the semiconductor layer sequence of the optoelectronic semiconductor body, with the result that leakage currents are avoided. The gap 49 can in turn be filled with an insulating material, for example $SiO_2$.

In addition, the semiconductor layer sequence is removed in the region of the connection contact 63, with the result that the surface of the material is uncovered. This forms a first contact panel 63' for contact-making. A second contact panel 63" likewise for contact-making is formed in a further region of the semiconductor body, in which the material of the semiconductor layer sequence is likewise removed. As a result of the series circuit formed by the four partial regions of the optoelectronic semiconductor body, all four partial regions can be supplied with the current required for operation by means of the contact panels 63' and 63".

The optoelectronic semiconductor body illustrated in FIG. 1G is provided for emitting electromagnetic radiation generated in the four partial regions during operation in the direction of the structured side of the semiconductor layer sequence. Electromagnetic radiation which, in the region of the active layer 22, is emitted in the direction of the replacement carrier 80 is reflected at the electrically conductive intermediate layer in the direction of the structured side of the layer sequence 20. As a result of the subdivision into four partial regions, the current of the optoelectronic semiconductor body that is required for operation is reduced, but in return the voltage required for operation is increased on account of the series circuit. In this exemplary embodiment, the optoelectronic component is subdivided into four partial regions, as a result of which the threshold voltage is increased by the factor four and the current consumption is simultaneously decreased by the corresponding factor. In the case of a material system based on InGaN, a light-emitting component having an operating voltage of twelve volts can be realized in this configuration.

In this respect, FIGS. 4A to 4F show a schematic illustration of an embodiment according to the principle proposed. FIG. 4A is a sectional illustration through an optoelectronic semiconductor body along the direction shown in FIG. 4E. Contact is made in each case in the edge region by means of the contact elements 410 and 411, respectively. The contact element 410 is electrically conductively connected to the perforations 446 making contact with the layer 21 of the semiconductor layer sequence 20. A active layer 22 is formed between the two differently doped layers 21 and 23, in which pn junction the charge earners injected during operation recombine and emit electromagnetic radiation. In addition, a lateral current distribution layer 450 is arranged onto the layer 23, said current distribution layer consisting of the same material as the contact layer 411 of the second partial region of the electronic semiconductor body.

The contact element 410 is electrically conductively connected to the perforations 446 making contact with the layer 21 of the semiconductor layer sequence 20. A pn junction 22 is formed between the two differently doped layers 21 and 23, in which pn junction the charge carriers injected during operation recombine and emit electromagnetic radiation. In addition, a lateral current distribution layer 450 is arranged onto the layer 23, said current distribution layer consisting of the same material as the contact layer 411 of the second partial region of the electronic semiconductor body.

A second electrical connection layer 460 makes contact with the current distribution layer 450 of the right-hand partial region of the optoelectronic semiconductor body and forms the perforation contact-connection for the layer 21' of the semiconductor layer sequence in the left-hand partial region of the optoelectronic semiconductor body. The second electrical connection layer 410 is correspondingly connected to the second layer 23' of the semiconductor layer sequence 20'.

As illustrated in the sectional FIG. 4A and also in the plan view in FIG. 4E, an isolating trench is provided between the left-hand and the right-hand partial region of the optoelectronic semiconductor body. The partial regions are thereby electrically isolated from one another. In the equivalent circuit diagram in accordance with FIG. 4C, in each case two diodes are thus connected in series. The diode effect here results from the illustrated pn junction of the semiconductor layer sequence 20 and 20', respectively.

FIG. 4B shows an alternative configuration, in which a plurality of pn junctions are provided instead of a single pn junction. These junctions act like two series-connected diodes, as is evident from the equivalent circuit diagram according to FIG. 4D.

The section in accordance with FIG. 4B is illustrated along the axes I as shown in FIG. 4F. In this exemplary embodiment, the optoelectronic semiconductor body is subdivided into four partial regions that are respectively separated in isolating fashion by a trench 442. The different connection layers 410, 411, 460 and 450 respectively make contact with the semiconductor layer sequences of the different partial regions and the pn junctions situated therein. The connection layers 410, 411, 450 to 470 are in this case configured in such a way that they connect up the four partial regions in the manner elucidated in the equivalent circuit diagram in accordance with FIG. 4D.

As a result, a series circuit composed of four instances of in each case two series-connected diodes is realized in the case of the optoelectronic semiconductor body according to an embodiment of the invention. Accordingly, a higher operating voltage is required during the operation of the arrangement. As a result of the elegant combination of series circuits in the epitaxial layer, expensive driver stages and high-current sources can be used since the powers is now fed into the optoelectronic semiconductor body in voltage-driven fashion at low currents. In addition, an optimized area utilization arises as a result of the avoidance of absorbent contacts, since all the light-generating component parts can be realized on an individual semiconductor body in a current-saving manner. In addition, a series circuit of chips can also only be embodied with only one top contact and one conductive carrier.

An example of this type is illustrated in FIG. 2.

The component according to an embodiment of the invention is embodied as a monolithic semiconductor body, that is to say that the individual layers were applied as one on top of another and were not produced in individual separate processes and subsequently connected to one another. As a result, the accuracy is improved and the stability is also increased.

In contrast to the previous exemplary embodiments, the perforation 203 in the exemplary embodiment in accordance with FIG. 2 is embodied through the active zone 200 as a perforation extending over the entire thickness of the semiconductor layer sequence. In the present case, therefore, the perforation 203 extends from the first main area at the top side right down to the second main area 202 of the semiconductor layer sequence. It forms a hole in the semiconductor layer sequence 200.

A further current spreading layer 209 is applied on the structured top side 225 of the semiconductor layer sequence 200. Said layer is arranged in addition to the current spreading layer 209 provided at the rear side of the semiconductor layer sequence. The two current spreading layers serve to ensure a best possible lateral current distribution and current coupling into the semiconductor layer sequence. As a result, the efficiency of the component is increased and, secondly, local heating as a result of an excessively large current flow into the semiconductor layer sequence is avoided. For this purpose, the current spreading layers have a smallest possible lateral sheet resistance.

Moreover, the current spreading layer 209' can additionally be embodied as transparent material for example in the form of a transparent conductive oxide such as ITO. The current spreading layer 209 on the side remote from the emission direction can be embodied preferably in reflective fashion but also in transparent fashion. In the latter case, as illustrated, the optoelectronic semiconductor body has an additional mirror layer 210. The latter is preferably embodied in non-conductive fashion if an additional insulating passivation layer is not provided between the mirror layer 210 and the material of the connection layer 203. In one embodiment, the mirror layer 210 can comprise the same material as the separating layers 205. This improves the reflection properties including in the case of emission parallel to the active layer of the semiconductor layer sequence as a result of reflections at the sidewalls.

For the purpose of contact-making, the current spreading layer is connected to the electrical connection layer 204 via feed perforations 210a. Said connection layer is coupled to a contact element 207 on the rear side by means of an electrical intermediate layer 208. The contact element 207 simultaneously also forms the replacement carrier substrate for the also the replacement carrier substrate for the optoelectronic semiconductor body.

Only one first partial region of the semiconductor body is shown in the exemplary embodiment according to FIG. 2. A further partial region of the semiconductor body adjoins, on the left-hand side, the first partial region illustrated here. The latter is embodied in such a way that the second electrical connection layer 204 is electrically conductively connected to a perforation (not shown) in the semiconductor layer sequence 200. The latter makes contact with the first layer 221 of the semiconductor layer sequence 200 of the second partial region and thus forms a series circuit. At the same time, the insulating material 205 and 210 arranged on the left-hand side forms the trench that separates the semiconductor layer sequence into partial regions.

In the previous exemplary embodiments, a series circuit was realized primarily by means of a corresponding arrangement of the connection layers within the semiconductor body. Furthermore, it is also conceivable, however, to form a part of the series circuit or interconnection variants externally in order thus to realize both series and parallel circuit and combinations thereof. As a result, by means of corresponding drive electronics, characteristic properties of the semiconductor body can be altered depending on the application. By way of example, it is conceivable, in the case of light headlights, for the luminous intensity to be varied by means of individual partial regions of the semiconductor body being correspondingly connected in or out.

Figure 3:
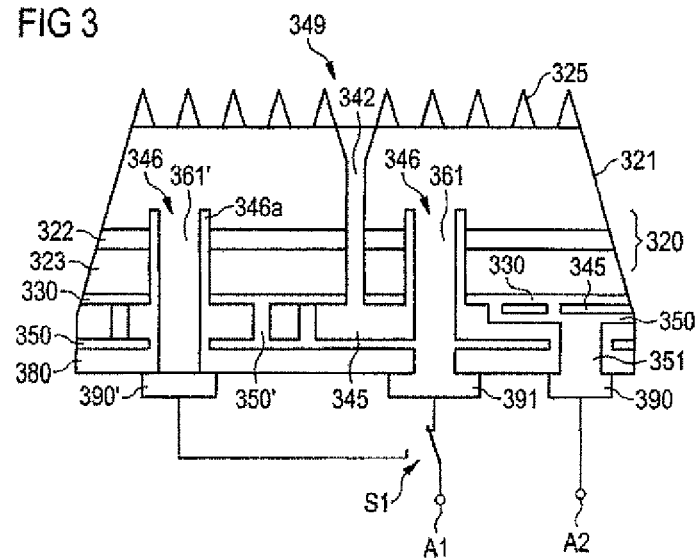
FIG. 3 shows a sectional illustration of an optoelectronic semiconductor body in accordance with a third embodiment.

FIG. 3 shows a cross-sectional illustration of a corresponding embodiment. In the case of the latter, all the contact elements are likewise arranged on the rear side. The semiconductor layer sequence 320 in turn contains a first n-doped layer 321, adjacent to which a p-doped layer 323 is applied. A pn junction 322 forms at the interface, as illustrated.

By way of example, InGaN/GaN, the emission spectrum of which lies in the range of visible blue light, can be used as material system of the layer sequence. An emission characteristic of the optoelectronic semiconductor body is improved by means of the applied structuring 325 provided. Moreover, a conversion means can furthermore be provided and applied on the surface of the structuring 325. Part of the emitted blue light is thereby converted into light having a different wavelength, whereby the generation of white light can be realized.

A conductive reflective connection layer 330 is arranged on that side of the second layer 323 of the semiconductor layer sequence 320 which is remote from the structuring 325. Said connection layer simultaneously also serves as a lateral current spreading layer for coupling in charge carriers. Contact is made with the layer 330 by a plurality of lead elements 350, which, for their part, are connected by means of a perforation 351 to a contact 390 arranged on the rear side.

Furthermore, a perforation 346 is provided, said perforation being filled with an electrically conductive material 361. The perforation extends from the rear side of the semiconductor body through all the layers as far as the layer 321 of the semiconductor layer sequence 320. Its sidewalls are substantially surrounded almost completely with an insulating material 364 in order to avoid a short circuit with the connection layer 330, for example. Furthermore, the contact 361 is connected to a rear-side contact 391 on the rear side of the optoelectronic semiconductor body and also to a conductive material layer 350'. This material layer 350' makes contact with the connection layer 330' of the left-hand partial region of the semiconductor body. The latter is completely electrically isolated from the right-hand partial region by an isolating trench 342. The trench 342 is filled with an insulation material, which also fills the interspaces between the individual leadthroughs 350' and 350. This insulating material can simultaneously be used as a carrier substrate for the replacement carrier 380.

The conductive layer 350' forms together with the layer 330' a first electrical connection layer of the left-hand partial region of the optoelectronic semiconductor body and makes contact with the layer 323 of the semiconductor layer sequence 320. A trench 361' is correspondingly also formed in the left-hand partial region of the semiconductor body, the sidewalls 346a of said trench being provided with an insulating material. The material of the trench 361' makes contact with contacts 390' situated on the rear-side surface.

Externally, the contacts 390' and also 391 on the rear side are coupled to an external switch S1, which leads to a first connection A1. The contact 390 is coupled to a second connection A2. In an operating mode of the arrangement, depending on the switch position S1, only the right-hand part of the optoelectronic component or both parts of the optoelectronic component is or are then supplied with current. In the switch position illustrated, during operation of the semiconductor arrangement, a current flows via the contact 390 and the feed 350 into the semiconductor layer sequence of the right-hand region of the semiconductor body. In the pn junction there, the charge carriers recombine and emit light. During operation, the left-hand partial region of the semiconductor body is switched off in the switch position illustrated.

If the connection A1 is then coupled to the contact 390' via the switch S1, then the current flows via the trench 361' in the right-hand partial region of the semiconductor body into the first electrical connection layer composed of the layers 350' and 330' in the left-hand partial region of the semiconductor body. As a result, the two semiconductor layer sequence and their pn junctions contained therein are connected in series.

Depending on the configuration of the individual connection layers and the contact-connection thereof in the respective partial regions, it is thus possible to achieve an external parallel or series circuit of the individual partial regions of an optoelectronic semiconductor body.

Figure 5A:
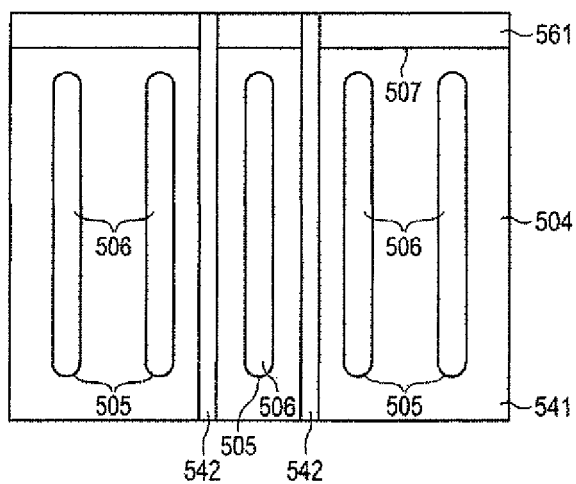
Figure 5B:
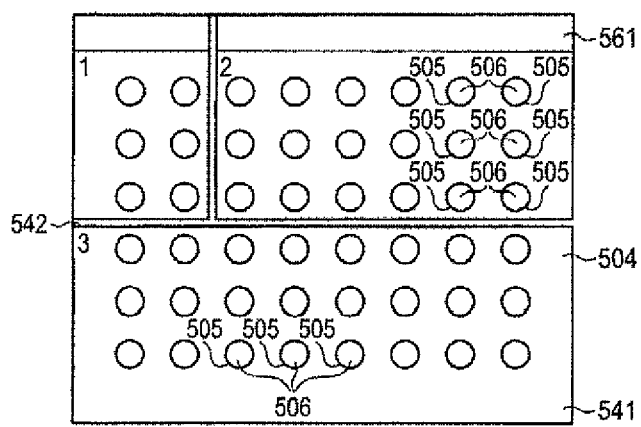

FIGS. 5A and 5B show different variants for the subdivision of an optoelectronic semiconductor body into different partial regions in a schematic plan view during the production process. Different forms of the perforation 505 and of the material of the active layer 506 that is uncovered thereby are illustrated, moreover. In addition, contact elements 507 are situated in an edge region of the respective semiconductor body, said contact elements subsequently forming part of the contact panels 561. In this configuration, the perforations 505 are embodied in trench-type fashion and penetrate through the insulating layer 541, and also the second layer and the active zone of the semiconductor layer sequence. Furthermore, the semiconductor body is subdivided by the trenches 542 into a total of three partial regions, wherein the middle partial region has a significantly smaller extent. By means of a corresponding interconnection of connection layers and also an outer external circuitry, it is possible to realize any desired form of series and parallel circuits by means of the regions illustrated.

In the embodiment in accordance with FIG. 5B, the perforations 505 are embodied in the form of regularly arranged circles. The latter penetrate through the insulating layer 504 and the underlying second layer and active zone of the semiconductor layer sequence 541. In this exemplary embodiment, too, trenches 542 are provided, which split the optoelectronic semiconductor body into partial regions of different sizes. In this exemplary embodiment, an interconnection is effected in such a way that a respective one of the two partial regions 1 and 2 either is supplied by itself with the energy required for operation or is interconnected with the partial region 3 in the form of a series circuit. In this case, this interconnection can be effected in series or in parallel depending on the desired application.

The invention proposed, namely splitting a semiconductor body by insulating subdivision into different partial regions and subsequently interconnecting said partial regions in the form of a series circuit or parallel circuit by means of suitable production of connection layers, is not restricted to the exemplary embodiments illustrated here. Rather, it encompasses any combination of possible interconnections and in this case, in particular, the configuration of the different connection layers. Any desired interconnection of a semiconductor body can be produced by means of corresponding structuring and production of the connection layers after production of the semiconductor layer sequence.

The production of an individual semiconductor body and the subsequent subdivision into different partial regions enable cost-effective manufacturing in conjunction with an increase in the luminous efficiency as a result of the geometrically close configuration. Through the use of LED structures with a plurality of pn junctions, so-called stepped LEDs, it is possible to achieve an elegant combination of series and parallel circuits. In particular, an interconnection can be effected in the epitaxial layer, the use of conductive carrier materials additionally being possible.

The invention claimed is:

1. An optoelectronic semiconductor body comprising:
   a substantially planar semiconductor layer sequence having a first main side and a second main side, said semiconductor layer sequence including an active layer suitable for generating electromagnetic radiation, wherein said first main side is provided for emitting said electromagnetic radiation;
   a trench that severs at least said active layer of said semiconductor layer sequence and serves for subdividing said active layer of said semiconductor layer sequence into at least two electrically insulated active partial layers; and
   a first electrical connection layer and a second electrical connection layer that are arranged on said second main side and respectively serving for making contact with a corresponding one of said at least two electrically insulated active partial layers, wherein said first and second electrical connection layers are electrically conductively coupled to each other in such a way that said at least two electrically insulated active partial layers form a series circuit.

2. The optoelectronic semiconductor body of claim 1, wherein said first electrical connection layer for making contact with a first of said at least two electrically insulated active partial layers is electrically conductively connected to said second electrical connection layer for making contact with a second of said at least two electrically insulated active partial layers.

3. The optoelectronic semiconductor body of claim 1, wherein said first electrical connection layer and said second electrical connection layer and a separating layer laterally overlap.

4. The optoelectronic semiconductor body of claim 1, wherein at least one of said first electrical connection layer and said second electrical connection layer reflects in the direction of said first main side a part of said electromagnetic radiation that is emitted by one of said at least two electrically insulated active partial layers in a direction toward said second main side.

5. The optoelectronic semiconductor body of claim 1, wherein a semiconducting or electrically insulating mirror layer is arranged at least in places between said semiconductor layer sequence and at least one of said first electrical connection layer and said second electrical connection layer.

6. The optoelectronic semiconductor body of claim 5, wherein said semiconducting or electrically insulating mirror layer has a plurality of openings and at least one of said first electrical connection layer and said second electrical connection layer extends through the openings to said semiconductor layer sequence.

7. The optoelectronic semiconductor body of claim 5, wherein said semiconducting or electrically insulating mirror layer covers at least 50% of said second main side of said semiconductor layer sequence.

8. The optoelectronic semiconductor body of claim 1, wherein said semiconductor layer sequence has a current spreading conductive oxide layer adjacent to said second main side.

9. The optoelectronic semiconductor body of claim 1, wherein each of said first and second electrical connection layers has a contact region suitable for making electrical contact with the optoelectronic semiconductor body from said second main side.

10. The optoelectronic semiconductor body of claim 1, wherein each of said first and second electrical connection layers comprises a partial element that forms a lead arranged outside the optoelectronic semiconductor body and is connected to a contact on a surface of the optoelectronic semiconductor body.

11. A method for producing an optoelectronic semiconductor body, comprising the steps of:
  epitaxially growing a semiconductor layer sequence on a growth substrate, wherein said semiconductor layer sequence has an active layer suitable for generating electromagnetic radiation and is provided for emitting said electromagnetic radiation from a first main side;
  forming an electrically insulating trench at least in said active layer of said semiconductor layer sequence for a purpose of subdivision said active layer into at least two active partial layers;
  applying a first electrical connection layer at a side of said semiconductor layer sequence that is remote from said first main side, for a purpose of making contact with said active layer;
  forming a separating layer at a side of said semiconductor layer sequence that is remote from said first main side; and
  applying a second electrical connection layer at a side of said semiconductor layer sequence that is remote from said first main side,
  wherein said first electrical connection layer, said separating layer and said second electrical connection layer are formed such that they laterally overlap at least in part, and
  wherein said first and second electrical connection layers make contact with said at least two active partial layers to form a series circuit.

12. The method of claim 11, further comprising:
  forming a perforation in said active layer; and
  forming a partial region of said second electrical connection layer in said perforation, wherein said second electrical connection layer is electrically insulated from said first electrical connection layer by said separating layer.

13. The method of claim 11, wherein said first electrical connection layer is formed in reflective fashion.

14. The method of claim 11, wherein a perforation is worked in said separating layer, wherein said perforation electrically conductively connects said first electrical connection layer to said second electrical connection layer, and wherein said first electrical connection layer makes contact with a first active partial layer and said second electrical connection layer makes contact with a second active partial layer.

15. The method of claim 14, further comprising:
  forming a first contact panel on a side remote from said first main side, wherein said first contact panel makes electrical contact with said first active partial layer in a manner making contact with said first electrical connection layer; and
  forming a second contact panel on said side remote from said first main side, wherein said second contact panel makes electrical contact with said second active partial layer in a manner making contact with said second electrical connection layer.

16. The optoelectronic semiconductor body of claim 3, wherein said first electrical connection layer is electrically separated from said second electrical connection layer by said separating layer.

\* \* \* \* \*